(12) United States Patent
Ishii et al.

(10) Patent No.: US 9,601,682 B2
(45) Date of Patent: *Mar. 21, 2017

(54) ELECTROACOUSTIC TRANSDUCER

(71) Applicant: TAIYO YUDEN CO., LTD., Taito-ku, Tokyo (JP)

(72) Inventors: Shigeo Ishii, Takasaki (JP); Takashi Tomita, Takasaki (JP); Fumihisa Ito, Takasaki (JP); Yutaka Doshida, Takasaki (JP); Yoshiyuki Watanabe, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/887,214

(22) Filed: Oct. 19, 2015

(65) Prior Publication Data

US 2016/0155926 A1 Jun. 2, 2016

(30) Foreign Application Priority Data

Dec. 2, 2014 (JP) ................................ 2014-243807

(51) Int. Cl.
| | | |
|---|---|---|
| H04R 25/00 | (2006.01) |
| H01L 41/053 | (2006.01) |
| H04R 17/00 | (2006.01) |
| H04R 17/10 | (2006.01) |
| H04R 1/24 | (2006.01) |
| H04R 1/02 | (2006.01) |
| H04R 1/10 | (2006.01) |
| H04R 7/20 | (2006.01) |

(52) U.S. Cl.
CPC ............. *H01L 41/053* (2013.01); *H04R 1/02* (2013.01); *H04R 1/1075* (2013.01); *H04R 1/24* (2013.01);

(Continued)

(58) Field of Classification Search
CPC .......... H04R 1/1075; H04R 1/24; H04R 1/26; H04R 5/033; H04R 9/06; H04R 17/00;

(Continued)

(56) References Cited

U.S. PATENT DOCUMENTS 4,330,729 A * 5/1982 Byrne .................... H04R 17/10
310/322
4,418,248 A * 11/1983 Mathis ..................... H04R 1/26
381/190

(Continued)

FOREIGN PATENT DOCUMENTS

JP 2013150305 A 8/2013

OTHER PUBLICATIONS

Non-Final Office Action issued by U.S. Patent and Trademark Office, dated Jul. 28, 2016, for co-pending U.S. Appl. No. 14/935,372.

(Continued)

*Primary Examiner* — Huyen D Le
(74) *Attorney, Agent, or Firm* — Law Office of Katsuhiro Arai

(57) ABSTRACT

In an embodiment, an electroacoustic transducer has a piezoelectric speaker 20, housing, and support member 23. The piezoelectric speaker 20 has a vibration plate 11 with a periphery 111, and a piezoelectric element 12 joined to the vibration plate 11. The housing houses the piezoelectric speaker 20. The support member 23 is constituted by a part of the housing or by a separate member, and supports the vibration plate 11 in multiple areas along the periphery 111. The electroacoustic transducer can offer excellent high-frequency characteristics.

13 Claims, 11 Drawing Sheets

(52) U.S. Cl.
CPC .............. *H04R 7/20* (2013.01); *H04R 17/00* (2013.01); *H04R 17/10* (2013.01); *H04R 2205/022* (2013.01); *H04R 2217/01* (2013.01); *H04R 2499/11* (2013.01)

(58) Field of Classification Search
CPC ........ H04R 17/02; H04R 17/06; H04R 17/10; H04R 2217/01; H04R 2499/11; H04R 7/20; H04R 17/005; H04R 2205/022
USPC ....... 381/309, 114, 173, 182, 186, 370, 190; 310/322, 324
See application file for complete search history.

(56) References Cited

U.S. PATENT DOCUMENTS

| | | | |
|---|---|---|---|
| 4,430,529 A * | 2/1984 | Nakagawa | H04R 17/00 310/324 |
| 4,654,554 A | 3/1987 | Kishi | |
| 4,965,483 A * | 10/1990 | Abe | G10K 9/122 310/324 |
| 5,430,803 A | 7/1995 | Kimura et al. | |
| 6,472,797 B1 | 10/2002 | Kishimoto | |
| 2003/0023937 A1 | 1/2003 | McManus et al. | |
| 2005/0023937 A1 | 2/2005 | Sashida et al. | |
| 2016/0119719 A1 | 4/2016 | Doshida et al. | |
| 2016/0119720 A1 | 4/2016 | Doshida et al. | |
| 2016/0119721 A1 | 4/2016 | Doshida et al. | |
| 2016/0157020 A1 | 6/2016 | Ishii et al. | |
| 2016/0157021 A1 | 6/2016 | Ishii et al. | |
| 2016/0183006 A1 | 6/2016 | Tokuhisa et al. | |

OTHER PUBLICATIONS

U.S. Appl. No. 14/930,528, Electroacoustic Transducer, filed Nov. 2, 2015.

Non-Final Office Action issued by U.S. Patent and Trademark Office, dated Jan. 12, 2017, for U.S. related U.S. Appl. No. 14/930,528.

* cited by examiner

A

B

A

B

A

B

ELECTROACOUSTIC TRANSDUCER

BACKGROUND

Field of the Invention

The present invention relates to an electroacoustic transducer that can be applied to earphones, headphones, mobile information terminals, etc., for example.

Description of the Related Art

Piezoelectric sounding bodies are widely used as simple means for electroacoustic conversion, where popular applications include earphones, headphones, and other acoustic devices as well as speakers for mobile information terminals, etc., for example. Piezoelectric sounding bodies are typically constituted by a vibration plate and a piezoelectric element attached to it (refer to Patent Literature 1, for example).

[Patent Literature 1] Japanese Patent Laid-open No. 2013-150305

SUMMARY

In recent years, there is a demand for higher sound quality in the field of earphones, headphones, and other acoustic devices. Accordingly, improving their electroacoustic conversion function characteristics is an absolute must for piezoelectric sounding bodies. When music is played, etc., for example, sibilant vocal sounds appearing in the high-frequency band may lead to lower sound quality. What is required, in this case, is electroacoustic conversion function with high-frequency characteristics capable of reducing sound pressure peaks of the sibilant sounds.

In light of the aforementioned situations, an object of the present invention is to provide an electroacoustic transducer offering excellent high-frequency characteristics.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, an electroacoustic transducer pertaining to an embodiment of the present invention has a piezoelectric speaker, housing, and support member.

The piezoelectric speaker has a vibration plate with a periphery, and a piezoelectric element joined to the vibration plate.

A housing houses the piezoelectric speaker.

A support member is constituted by a part of the housing or by a separate member, and supports the vibration plate in multiple areas of the periphery.

With the aforementioned electroacoustic transducer, the periphery of the vibration plate is supported by the support member in multiple areas. This way, more vibration of the periphery of the vibration plate is permitted when the piezoelectric element is driven, compared to when the entire periphery of the vibration plate is fixed to the support member, and desired high-frequency characteristics can be achieved as a result.

Also, to achieve the aforementioned object, an electroacoustic transducer pertaining to another embodiment of the present invention has a piezoelectric speaker, housing, support member, and elastically deformable adhesive layer.

The piezoelectric speaker has a vibration plate with a periphery, and a piezoelectric element joined to the vibration plate.

The housing houses the piezoelectric speaker.

The support member is constituted by a part of the housing or by a separate member, and supports the periphery.

The adhesive layer is provided between the periphery and support member.

With the aforementioned electroacoustic transducer, the periphery of the vibration plate is supported by the support member via the elastically deformable adhesive layer. This way, more vibration of the periphery of the vibration plate is permitted when the piezoelectric element is driven, compared to when the entire periphery of the vibration plate is firmly fixed to the support member, and desired high-frequency characteristics can be achieved as a result.

As explained above, according to the present invention, an electroacoustic transducer offering excellent high-frequency characteristics can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

Figure 1:
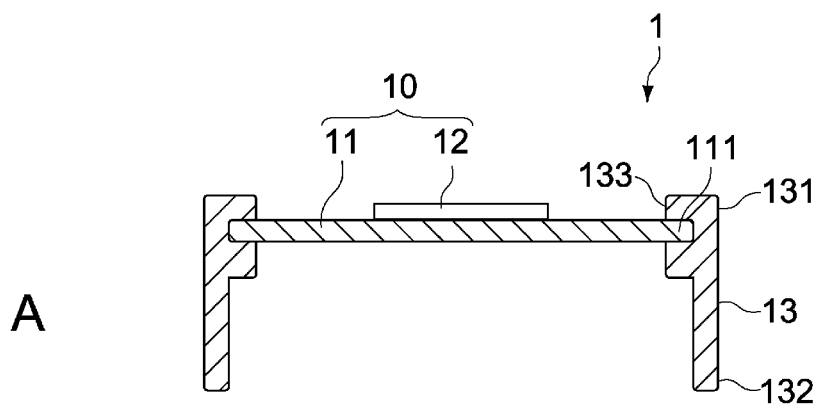
FIG. 1 is a schematic constitutional diagram of a speaker unit pertaining to a reference example of an embodiment of the present invention, where A is a lateral section view and B is a plan view.
Figure 1:
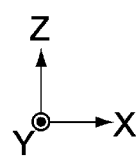
Figure 1:
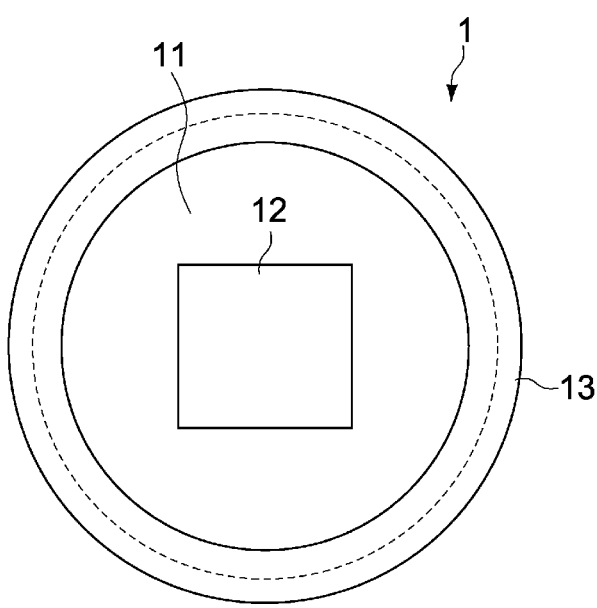
Figure 1:
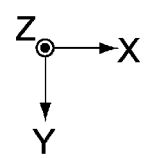

DESCRIPTION OF THE SYMBOLS 2, 3, 4, 5, 6, 7 - - - Speaker unit
11, 51, 61 - - - Vibration plate
12 - - - Piezoelectric element
20, 50, 60 - - - Piezoelectric speaker
25 - - - Dynamic speaker
23, 33, 43, 53, 73 - - - Support member
34, 44, 74 - - - Adhesive layer
41 - - - Housing
100, 200 - - - Earphone (electroacoustic transducer)
111 - - - Periphery (of the vibration plate)
134 - - - Annular member (support member)
230, 330, 430, 530, 730 - - - Annular body
233, 433 - - - Projection
511 - - - Projecting piece

DETAILED DESCRIPTION OF EMBODIMENTS

Embodiments of the present invention are explained below by referring to the drawings.

Basic Constitution

Reference Example

First, the basic constitution of a speaker unit pertaining to a reference example of this embodiment is explained.

A and B in FIG. 1 are a lateral section view and plan view, respectively, schematically showing a speaker unit 1 pertaining to the reference example. In the figures, the X, Y, and Z-axes represent three axial directions intersecting one another at right angles (the same applies to the figures referenced hereinafter).

The speaker unit 1 has an electromagnetic sounding body 10 with a vibration plate 11 and piezoelectric element 12, and a support member 13 that supports the piezoelectric speaker 10. The piezoelectric speaker 10 generates sound waves having a sound pressure peak near 8 kHz, for example, and is housed, via the support member 13, inside the housing (not illustrated here) of the electroacoustic transducer of an earphone, headphone, etc.

The vibration plate 11 is constituted by metal (such as 42 alloy) or other conductive material, or by resin (such as liquid crystal polymer) or other insulating material, and its planar shape is formed circular. The outer diameter and thickness of the vibration plate 11 are not limited in any way, and can be set as deemed appropriate according to the frequency band of playback sound waves, etc., where, in this example, a disk-shaped vibration plate of approx. 12 mm in diameter and approx. 0.2 mm in thickness is used.

The piezoelectric element 12 functions as an actuator that vibrates the vibration plate 11. The piezoelectric element 12 is integrally joined to the principle surface of the vibration plate 11. In this example, the piezoelectric speaker 10 has a unimorph structure where the piezoelectric element 12 is joined to one principle surface of the vibration plate 11.

The piezoelectric element 12 may be joined to either principle surface of the vibration plate 11, where, in the example shown, the piezoelectric element 12 is joined to the principle surface on the side opposite to the principle surface facing the interior of the support member 13. The piezoelectric element 12 is placed roughly at the center of the vibration plate 11. This way, the vibration plate 11 can be oscillated and driven isotropically with respect to its entire in-plane area.

The planar shape of the piezoelectric element 12 is formed polygonal, and although it is rectangular (oblong) in this example, the shape can be square, parallelogram, trapezoid, or other quadrangle, or any polygon other than quadrangle, or circle, oval, ellipsoid, etc. The thickness of the piezoelectric element 12 is not limited in any way, either, and can be approx. 50 μm, for example.

The piezoelectric element 12 is structured as a stack of alternating multiple piezoelectric layers and multiple electrode layers. Typically the piezoelectric element 12 is made by sintering at a specified temperature a stack of alternating multiple ceramic sheets, each made of lead zirconate titanate (PZT), alkali metal-containing niobium oxide, etc., and having piezoelectric characteristics on one hand, and electrode layers on the other. One end of respective electrode layers is led out alternately to both longitudinal end faces of the dielectric layer. The electrode layers exposed to one end face are connected to a first leader electrode layer, while the electrode layers exposed to the other end face are connected to a second leader electrode layer. The piezoelectric element 12 expands and contracts at a specified frequency when a specified AC voltage is applied between the first and second leader electrode layers, while the vibration plate 11 is vibrated at a specified frequency.

The support member 13 is formed in a ring shape, where, in this example, it is shaped as a cylinder having the axis in the Z-axis direction. The support member 13 has a first end 131 and a second end 132 on the opposite side. A periphery 111 of the vibration plate 11 is supported all around by a retention part 133 provided at the first end 131. The support member 13 is constituted by an injection molding made of synthetic resin material, and typically the periphery 111 of the vibration plate 11 is firmly fixed to the retention part 133 in the form of insert molding.

Figure 2:
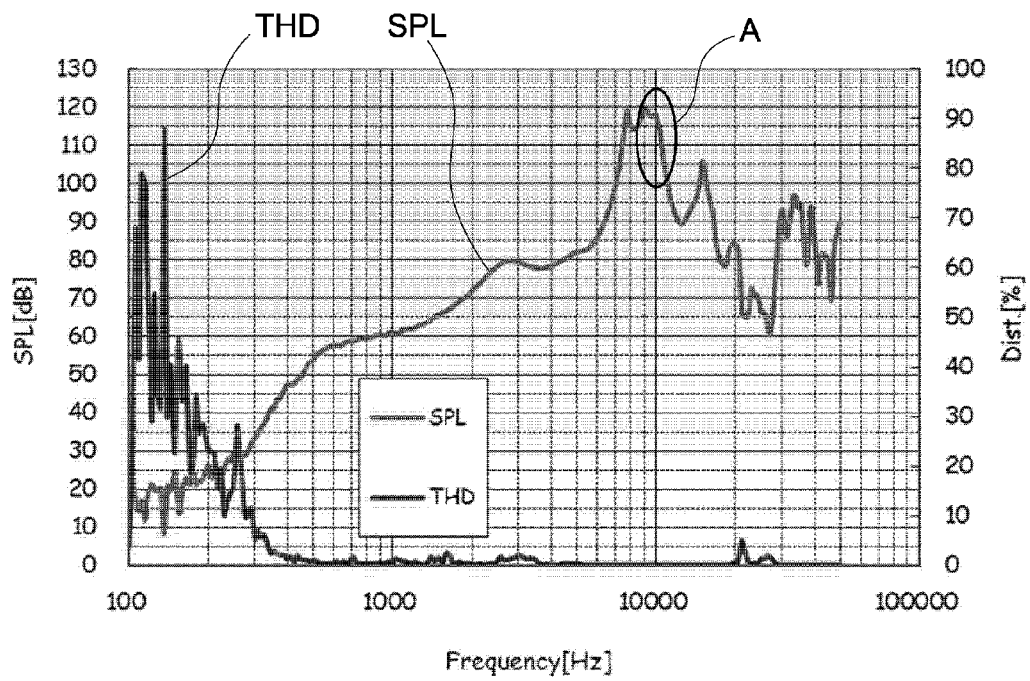
FIG. 2 shows results of an experiment showing the frequency characteristics of the speaker unit pertaining to the reference example.

FIG. 2 shows the oscillation frequency characteristics of the speaker unit 1 of the aforementioned constitution. In FIG. 2, the horizontal axis represents frequency [Hz] (logarithmic scale), the left vertical axis represents sound pressure level (SPL) [dB], and the right vertical axis represents total harmonic distortion (THD) [%], respectively.

As for the measurement, an earphone coupler was used to evaluate the characteristics according to the headphone and earphone standards (JEITA RC-8140A) by the Japan Electronics and Information Technology Industries Association.

As shown in FIG. 2, the speaker unit 1 pertaining to the reference example has the first sound pressure peak near 8 kHz, while the second sound pressure peak is also observed near 9 to 10 kHz as shown in oval area A in the figure. This second sound pressure peak is generally a cause of prominent sibilant vocal sounds in music and should desirably be suppressed as much as possible.

Additionally, a relatively high Q value (sharpness of resonance) of the speaker unit 1 near 9 to 10 kHz is one reason why the second sound pressure peak emerges. It is therefore thought that the second sound pressure peak can be made to disappear if the Q value of the speaker unit near 9 to 10 kHz is reduced.

Accordingly, this embodiment provides an ingenious support structure for the vibration plate 11, the details of which are explained below, for the purpose of suppressing the sound pressure peak that may emerge in an unintended frequency band and thereby obtaining desired high-frequency characteristics.

First Embodiment

Figure 3:
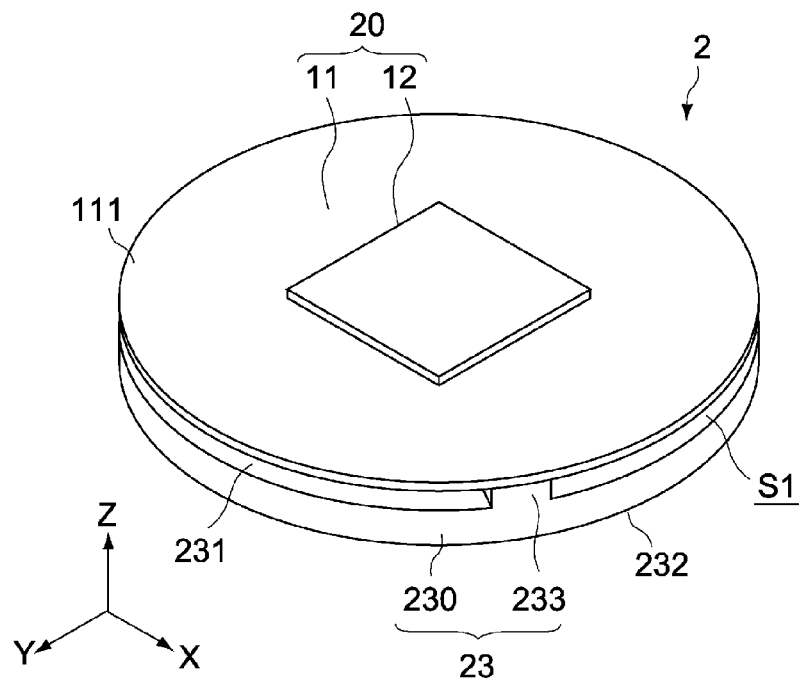
FIG. 3 is a general perspective view of the speaker unit of an electroacoustic transducer pertaining to the first embodiment of the present invention.
Figure 4:
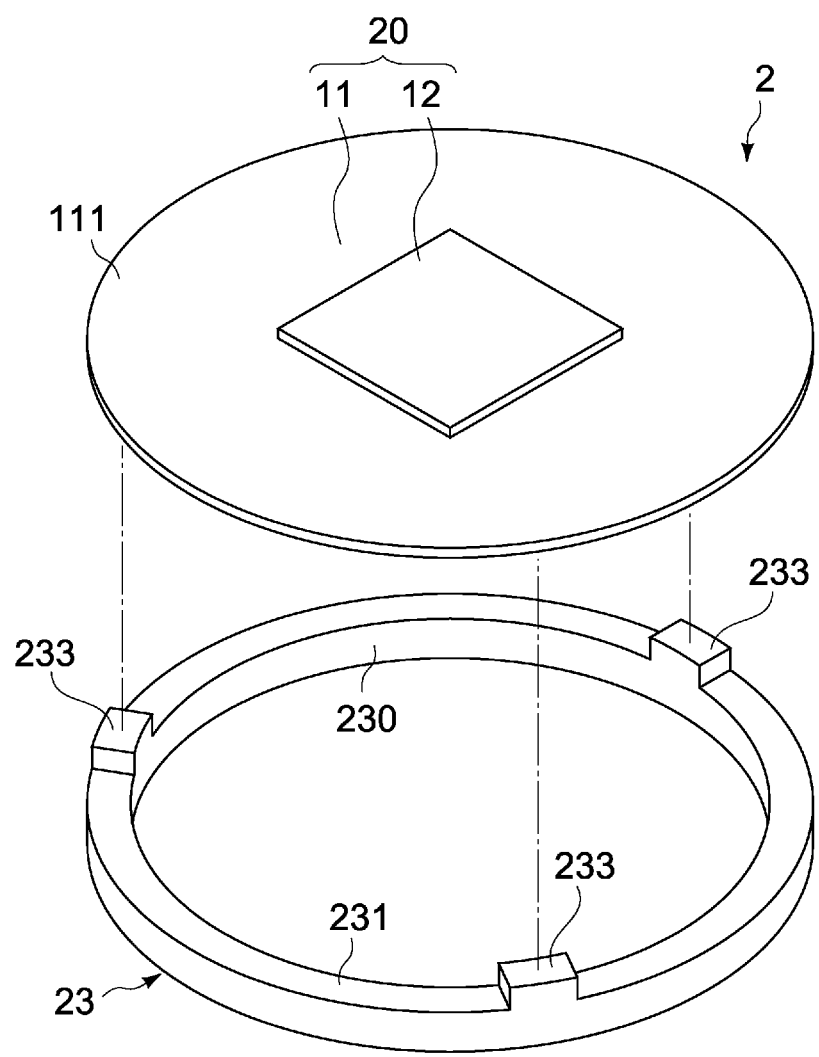
FIG. 4 is an exploded perspective view of the speaker unit shown in FIG. 3.

FIG. 3 is a general perspective view of a speaker unit pertaining to the first embodiment of the present invention, while FIG. 4 is an exploded perspective view of the same.

A speaker unit 2 in this embodiment has a piezoelectric speaker 20 and support member 23. The speaker unit 2 is housed inside a housing not illustrated here, to constitute an electroacoustic transducer for an earphone, headphone, etc.

The piezoelectric speaker 20 has a vibration plate 11 and piezoelectric element 12. The vibration plate 11 and piezoelectric element 12 are constitutionally identical to the vibration plate 11 and piezoelectric element 12 of the electroacoustic transducer 1 pertaining to the aforementioned reference example and therefore not explained here.

The support member 23 supports the vibration plate 11 in multiple areas of its periphery 111. The support member 23 may be constituted by a part of the housing or by a member independent of the housing.

In this embodiment, the support member 23 has an annular body 230, and multiple projections 233 to support the periphery 111 of the vibration plate 11. The support member 23 is constituted by an injection molding made of synthetic resin material, but the foregoing is not the only material and it can also be constituted by metal material.

The annular body 230 is constituted by a ring-shaped or cylindrical member of roughly the same outer diameter as that of the vibration plate 11, and has a first end 231 facing the periphery 111 of the vibration plate 11 and a second end 232 on the opposite side. The thickness (height) of the annular body 230 in the Z-axis direction is not limited in any way so long as it is large enough to ensure sufficient strength to retain the piezoelectric speaker 20 in a stable manner.

The multiple projections 233 are provided on the end face of the first end 231 of the annular body 230 in a manner projecting to the periphery 111 of the vibration plate 11. The multiple projections 233 have the same height and are spaced at equal or unequal angular intervals. There are three projections 233 in this embodiment, but the foregoing is not the only number of projections and there may be four or more projections. Since there are three or more projections 233, the vibration plate 11 can be supported within the XY plane in a stable manner.

The periphery 111 of the vibration plate 11 is supported at multiple points by the multiple projections 233. The periphery 111 of the vibration plate 11 is joined to the top surface of each projection 233 by adhesive agent or adhesive material, but the foregoing is not the only joining method and it may be joined to each projection 233 by means of fixing with threads, clinching, etc.

The speaker unit 2 in this embodiment having the above constitution generates sound waves with a sound pressure peak near 8 kHz, for example, as the vibration plate 11 vibrates at a specified frequency due to driving of the piezoelectric element 12. In this embodiment, the periphery 111 of the vibration plate 11 is supported by the multiple projections 233 of the support member 23. Accordingly, more vibration of the periphery 111 of the vibration plate 11 is permitted, compared to when the periphery 111 is firmly fixed all around as in the aforementioned reference example, and desired high-frequency characteristics can be achieved as a result.

Figure 5:
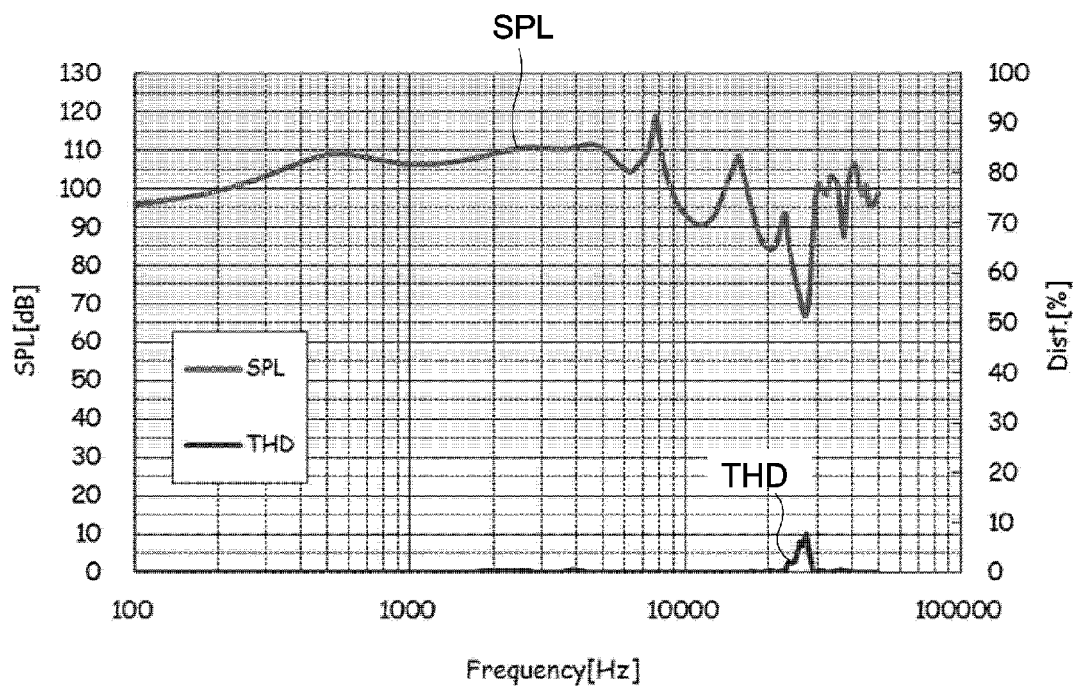
FIG. 5 shows results of an experiment showing the frequency characteristics of the speaker unit shown in FIG. 3.

FIG. 5 shows the oscillation frequency characteristics of the speaker unit 2 in this embodiment. As for the measurement, a method similar to the one used to measure the frequency characteristics pertaining to the reference example (FIG. 2) was adopted.

As shown in FIG. 5, according to the speaker unit 2 of this embodiment the second sound pressure peak present near 9 to 10 kHz (refer to FIG. 2) can be reduced or made to disappear while still maintaining the sound pressure peak near 8 kHz. This is probably due to the supporting of the periphery 111 of the vibration plate 11 by the support member 23 in multiple areas, which mitigates the supporting strength and symmetry of the periphery 111 compared to a structure where the periphery 111 of the vibration plate 11 is firmly fixed as in the aforementioned reference example. Mitigation of the supporting strength and symmetry of the periphery 111 of the vibration plate 11 means that the periphery 111 is more loosely fixed, which in turn increases the degree of freedom of vibration of the periphery 111 and consequently reduces the Q value of resonance. As explained above, optimizing the support structure of the vibration plate 11 in a manner reducing the sound pressure peak or making it disappear in the target frequency band (9 to 10 kHz in this example) allows for easy achievement of desired high-frequency characteristics.

It was also confirmed that, according to this embodiment, sound pressure levels in high-pitch bands of 10 kHz and above would increase compared to those in the reference example. This is likely due to the excitation of higher-order resonance of the piezoelectric speaker partly because the periphery is not firmly fixed and partly because the symmetry of support is low. It was confirmed by the experiments conducted by the inventors of the present invention that the aforementioned effects would become greater when the number of supports is low such as 3, 5 or 7 and the symmetry is low.

In order to optimize the vibration mode or vibration form of the periphery 111 of the vibration plate 11, the constitution may be such that the periphery 111 of the vibration plate 11 is elastically supported. In this case, the periphery 111 of the vibration plate 11 may be joined to each of the multiple projections 233 of the support member 23 via an elastically deformable adhesive material. Or, the speaker unit 2 may be further equipped with an elastically deformable adhesive layer that fills a void (void formed between the first end 231 of the annular body 230 and the periphery 111 of the vibration plate 11) S1 (refer to FIG. 3) formed between the multiple projections 233.

Figure 6:
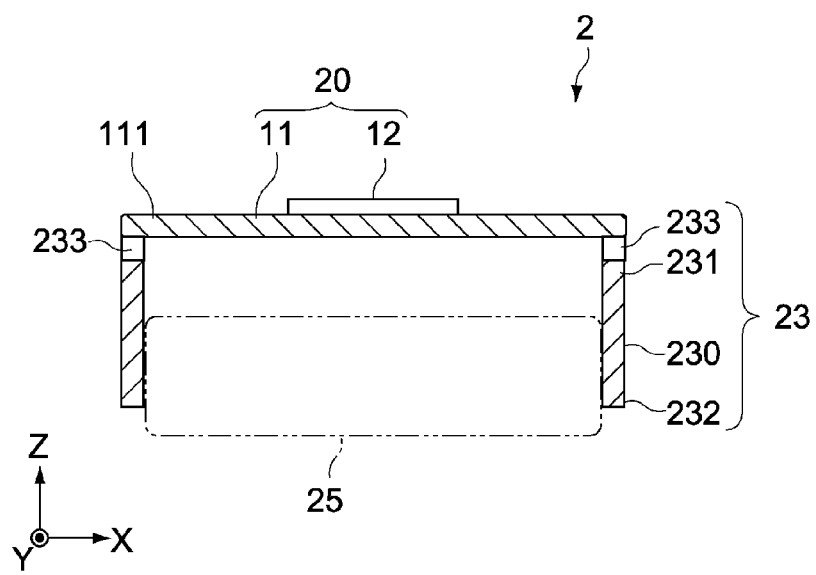
FIG. 6 is a schematic lateral section view showing a constitutional variation example of the speaker unit shown in FIG. 3.

Also, the speaker unit 2 in this embodiment may be further equipped with an dynamic speaker 25 as shown in FIG. 6. In this case, the dynamic speaker 25 is placed inside the support member 23 in a manner facing the Z-axis direction of the piezoelectric speaker 20 (vibration plate 11). In the example of FIG. 6, the annular body 230 is constituted by a cylindrically shaped member, and the outer periphery surface of the dynamic speaker 25 is bonded and fixed to the inner periphery surface of the second end 232 thereof. In addition to the above, the dynamic speaker 25 may be supported by a member different from the support member 23.

The dynamic speaker 25 includes a vibration body such as a voice coil motor (solenoid coil), and is constituted as a speaker unit (woofer) that primarily generates low-pitch sound waves of 7 kHz and lower, for example. On the other hand, the piezoelectric speaker 20 is constituted as a speaker unit (tweeter) that primarily generates high-pitch sound waves of 7 kHz and higher, for example. This way, an electroacoustic transducer can be constituted as a hybrid speaker having a low-pitch sounding body and high-pitch sounding body.

In general, a hybrid speaker is known to easily generate sibilant sounds in a high-frequency band near 9 to 10 kHz. In other words, sound pressure peaks that are not conspicuous when a tweeter alone is used often become prominent when a woofer is combined, and this leads to amplification of sibilant sounds to a level where they can no longer be ignored. The present invention is particularly effective in such a hybrid speaker, as it modifies the support structure of the piezoelectric speaker to reduce sibilant sounds considerably.

Also in this embodiment, the void S1 formed between the multiple projections 233 may be constituted as a passage to let the sound generated by the dynamic speaker 25 pass through. This way, it becomes possible to adjust the frequency characteristics of the sound waves played back by the dynamic speaker 25. This also makes it possible to optimize the frequency characteristics around the cross point between the high-pitch sound characteristic curve played back by the piezoelectric speaker 20 and the low-pitch sound characteristic curve played back by the dynamic speaker 25.

Second Embodiment

Figure 7:
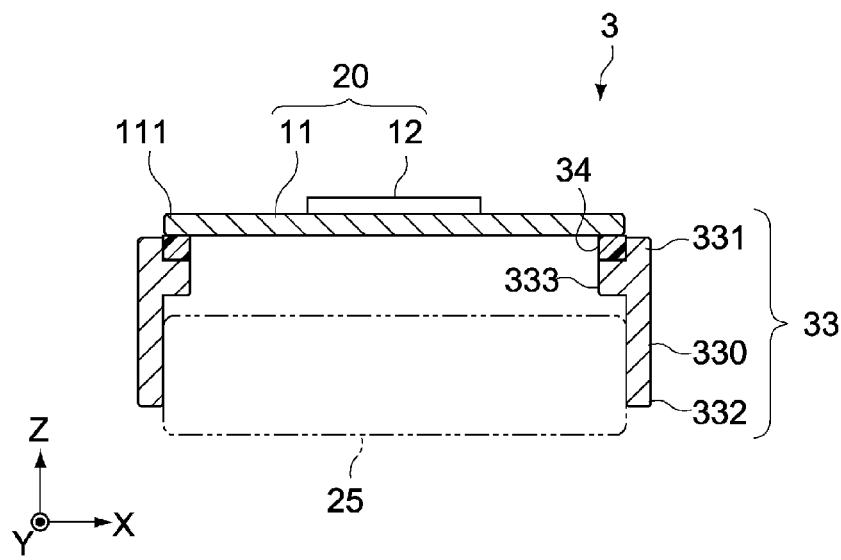
FIG. 7 is a schematic lateral section view of the speaker unit of an electroacoustic transducer pertaining to the second embodiment of the present invention.

FIG. 7 is a schematic lateral section view showing the constitution of a speaker unit 3 pertaining to the second embodiment of the present invention. Constitutions different from those of the first embodiment are primarily explained below, and the same constitutions as in the first embodiment are not explained or explained briefly using the same symbols.

The speaker unit 3 in this embodiment has a piezoelectric speaker 20 and support member 33.

The speaker unit 3 is housed inside a housing not illustrated here, to constitute an electroacoustic transducer for an earphone, headphone, etc.

In this embodiment, the support member 33 elastically supports the periphery 111 of the vibration plate 11 all around. The support member 33 may be constituted by a part of the housing or by a member independent of the housing.

The support member 33 has an annular body 330, and a ring-shaped convex 333 that supports the periphery 111 of the vibration plate 11. The support member 33 is constituted by an injection molding made of synthetic resin material, but the foregoing is not the only material and it can also be constituted by metal material.

The annular body 330 is constituted by a ring-shaped or cylindrical member of an inner diameter greater than the outer diameter of the vibration plate 11, and has a first end 331 facing the periphery 111 of the vibration plate 11 and a second end 332 on the opposite side.

The ring-shaped convex 333 is provided in a manner projecting diametrically inward to the inner periphery surface of the first end 331 of the annular body 330. The outer diameter of the ring-shaped convex 333 is formed to a size equivalent to or greater than the outer diameter of the vibration plate 11 and is constituted in such a way that it can support the periphery 111 of the vibration plate 11. Then, the periphery 111 of the vibration plate 11 is joined to the top surface of the ring-shaped convex 333 via an elastically deformable adhesive layer 34.

The adhesive layer 34 is not specifically limited so long as it is adhesive material that exhibits elasticity when cured, but typically it is constituted by silicone resin, urethane resin, or other elastically deformable resin material. This way, the periphery 111 of the vibration plate 11 is elastically supported by the support member 33.

Or, the adhesive layer 34 may be constituted by double-sided tape (double-sided adhesive tape). Constituting the adhesive layer 34 with double-sided tape makes it easy to control the thickness of the adhesive layer 34.

Also, the speaker unit 3 in this embodiment may be further equipped with an dynamic speaker 25. In this case, the dynamic speaker 25 is placed inside the support member 33 in a manner facing the Z-axis direction of the piezoelectric speaker 20 (vibration plate 11). In the example, the annular body 330 is constituted by a cylindrically shaped member, and the outer periphery surface of the dynamic speaker 25 is bonded and fixed to the inner periphery surface of the second end 332 thereof. In addition to the above, the dynamic speaker 25 may be supported by a member different from the support member 33.

Figure 8:
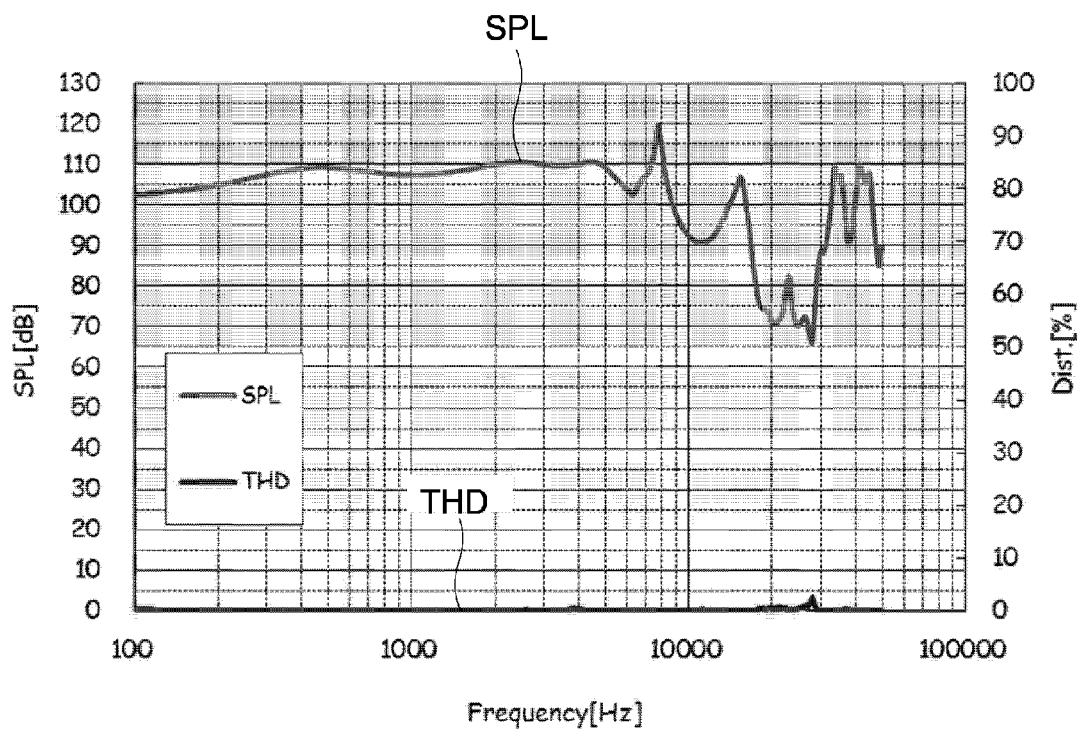
FIG. 8 shows results of an experiment showing the frequency characteristics of the speaker unit shown in FIG. 7.

FIG. 8 is the result of an experiment showing the oscillation frequency characteristics of the speaker unit 3 in this embodiment.

As for the measurement, a method similar to the one used to measure the frequency characteristics pertaining to the reference example (FIG. 2) was adopted.

As shown in FIG. 8, according to the speaker unit 3 of this embodiment the second sound pressure peak present near 9 to 10 kHz (refer to FIG. 2) can be reduced or made to disappear while still maintaining the sound pressure peak near 8 kHz, just like in the first embodiment. This is probably due to the elastic supporting of the periphery 111 of the vibration plate 11 by the support member 33 via the adhesive layer 34, which mitigates the supporting strength of the periphery 111 compared to a structure where the periphery 111 of the vibration plate 11 is firmly fixed as in the aforementioned reference example. Mitigation of the supporting strength of the periphery 111 of the vibration plate 11 means that the periphery 111 is more loosely fixed, which in turn increases the degree of freedom of vibration of the periphery 111 and consequently reduces the Q value of resonance. As explained above, optimizing the support structure of the vibration plate 11 in a manner reducing the sound pressure peak or making it disappear in the target frequency band (9 to 10 kHz in this example) allows for easy achievement of desired high-frequency characteristics. Also in this embodiment, THD decreased. This is probably due to the suppression of nonlinearity as the periphery 111 is supported in a softer manner.

The adhesive layer 34 may include spherical insulation fillers of uniform grain size. By constituting the adhesive layer 34 with adhesive material in which insulation fillers are dispersed, the thickness of the adhesive layer 34 can be adjusted accurately. This allows for highly accurate control of the vibration damping function of the vibration plate 11 by the adhesive layer 34, making it possible to achieve desired high-frequency characteristics in a stable manner.

Figure 9:
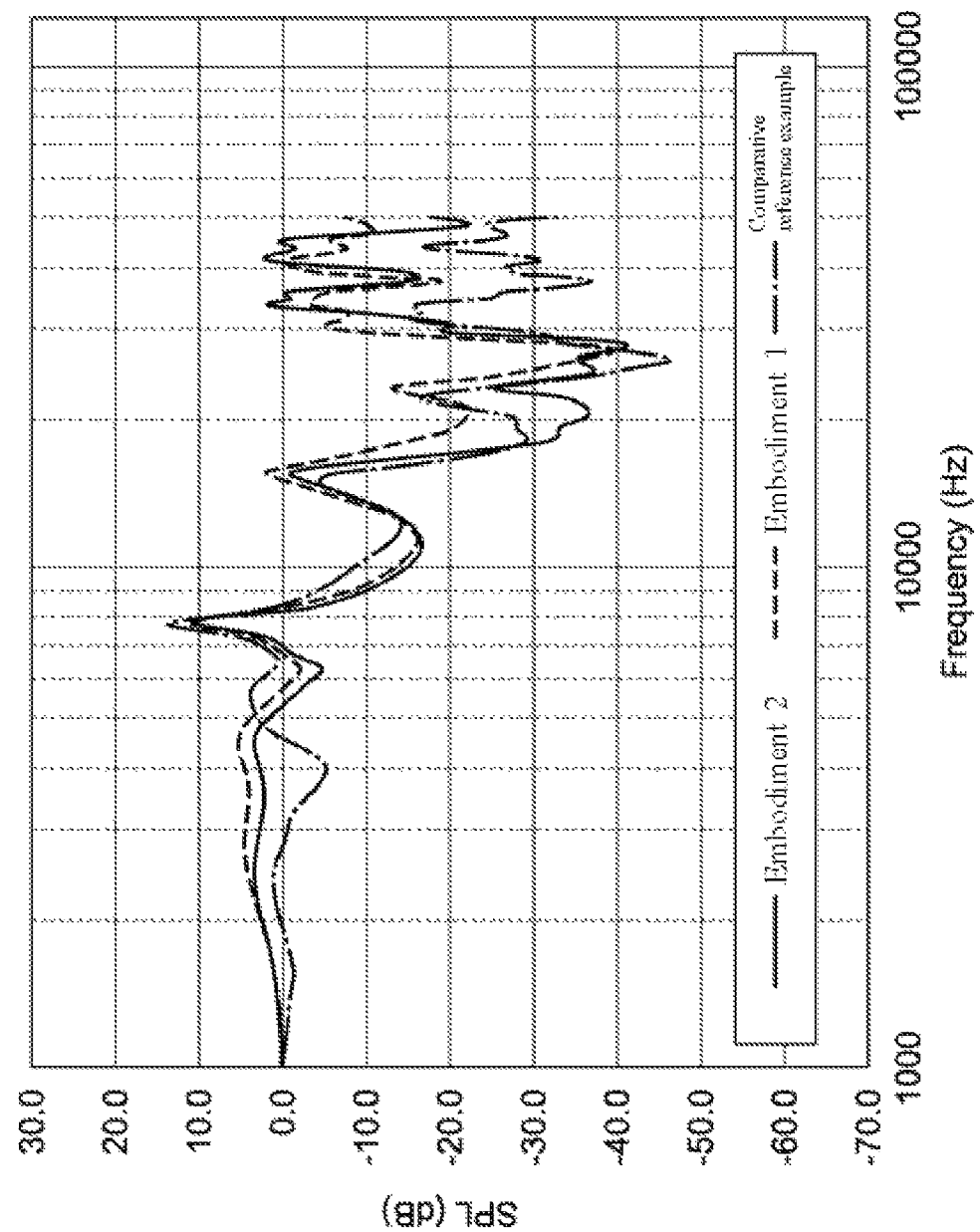
FIG. 9 is a graph comparing the frequency characteristics of the speaker unit shown in FIG. 3 and speaker unit shown in FIG. 7.

FIG. 9 is the result of an experiment showing the high-frequency characteristics of the speaker unit 3 pertaining to this embodiment and the speaker unit 2 pertaining to the first embodiment mentioned above. For the purpose of comparison, the high-frequency characteristics of a commercially available canal-type earphone are also shown. It should be noted that, in the figure, the solid line, broken line, and one-dot chain line represent the high-frequency characteristics of the speaker unit 3 in this embodiment, the speaker unit 2 in the first embodiment, and a commercially available canal-type earphone, respectively.

Third Embodiment

Figure 10:
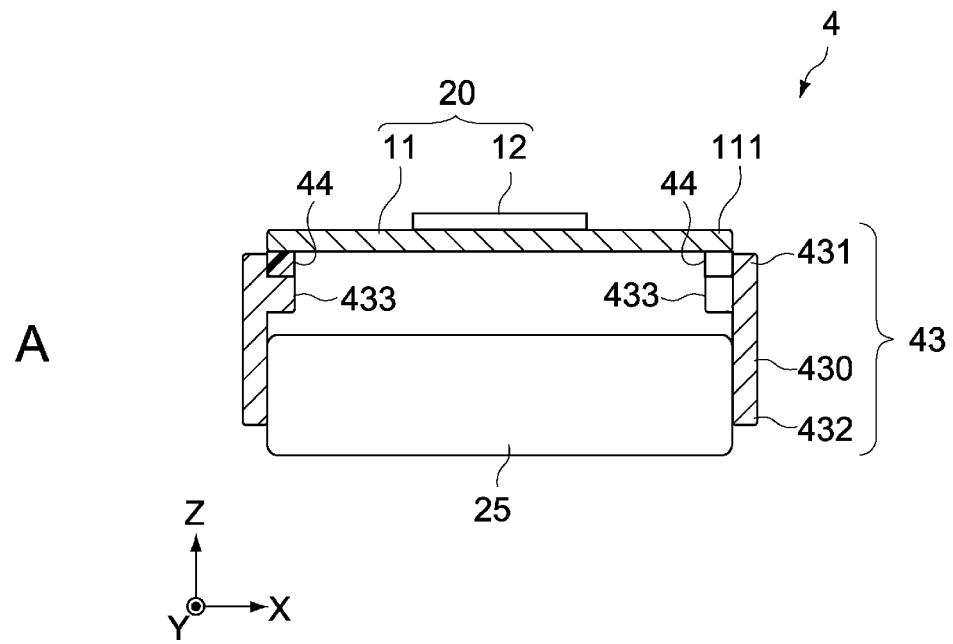
FIG. 10 is a schematic constitutional diagram of the speaker unit of an electroacoustic transducer pertaining to the third embodiment of the present invention, where A is a lateral section view and B is a plan view.
Figure 10:
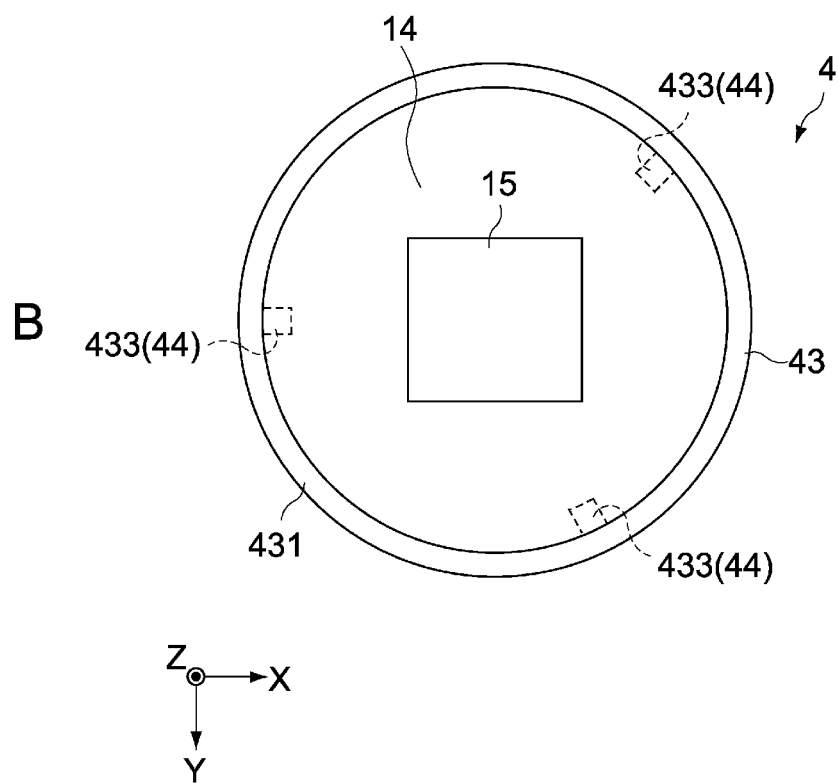

A and B in FIG. 10 are a schematic lateral section view and plan view, respectively, showing the constitution of a speaker unit 4 pertaining to the third embodiment of the present invention. Constitutions different from those of the first embodiment are primarily explained below, and the same constitutions as in the first embodiment are not explained or explained briefly using the same symbols.

The speaker unit 4 in this embodiment has a piezoelectric speaker 20 and support member 43.

The speaker unit 4 is housed inside a housing not illustrated here, to constitute an electroacoustic transducer for an earphone, headphone, etc.

In this embodiment, the support member 43 supports the vibration plate 11 in multiple areas of its periphery 111. The support member 43 may be constituted by a part of the housing or by a member independent of the housing.

The support member 43 has an annular body 430, and multiple projections 433 to support the periphery 111 of the vibration plate 11. The support member 43 is constituted by an injection molding made of synthetic resin material, but the foregoing is not the only material and it can also be constituted by metal material.

The annular body 430 is constituted by a ring-shaped or cylindrical member of an inner diameter greater than the outer diameter of the vibration plate 11, and has a first end 431 facing the periphery 111 of the vibration plate 11 and a second end 432 on the opposite side.

The multiple projections 433 are provided in a manner projecting diametrically inward to the inner periphery surface of the first end 431 of the annular body 430. The multiple projections 433 have the same width (projected amount) and are spaced at equal or unequal angular intervals. The projected amount of each projection 433 is not specifically limited so long as it is big enough to support the periphery 111 of the vibration plate 11. Then, the periphery 111 of the vibration plate 11 is joined to the top surface of each projection 433 via an elastically deformable adhesive layer 44. The adhesive layer 44 is constituted in the same manner as the adhesive layer 34 (refer to FIG. 7) explained in the second embodiment.

Also, the speaker unit 4 in this embodiment may be further equipped with an dynamic speaker 25. In this case, the dynamic speaker 25 is placed inside the support member 43 in a manner facing the Z-axis direction of the piezoelectric speaker 20 (vibration plate 11). In the example, the annular body 430 is constituted by a cylindrically shaped member, and the outer periphery surface of the dynamic speaker 25 is bonded and fixed to the inner periphery surface of the second end 432 thereof. In addition to the above, the dynamic speaker 25 may be supported by a member different from the support member 43.

The speaker unit 4 of this embodiment as constituted above can also achieve operations and effects similar to those achieved by the speaker units 2, 3 pertaining to the first and second embodiments.

Fourth Embodiment

Figure 11:
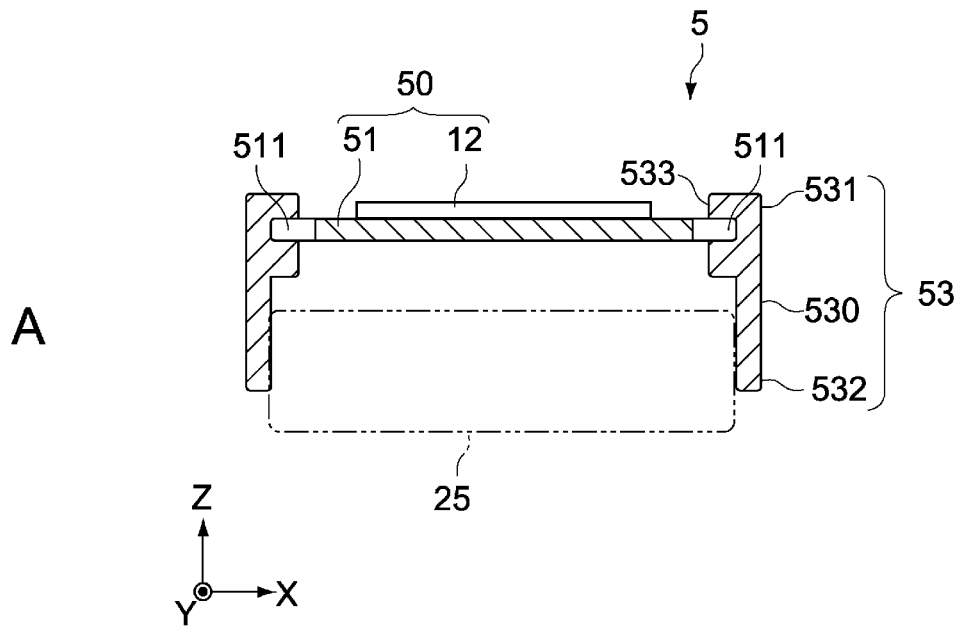
FIG. 11 is a schematic constitutional diagram of the speaker unit of an electroacoustic transducer pertaining to the fourth embodiment of the present invention, where A is a lateral section view and B is a plan view.
Figure 11:
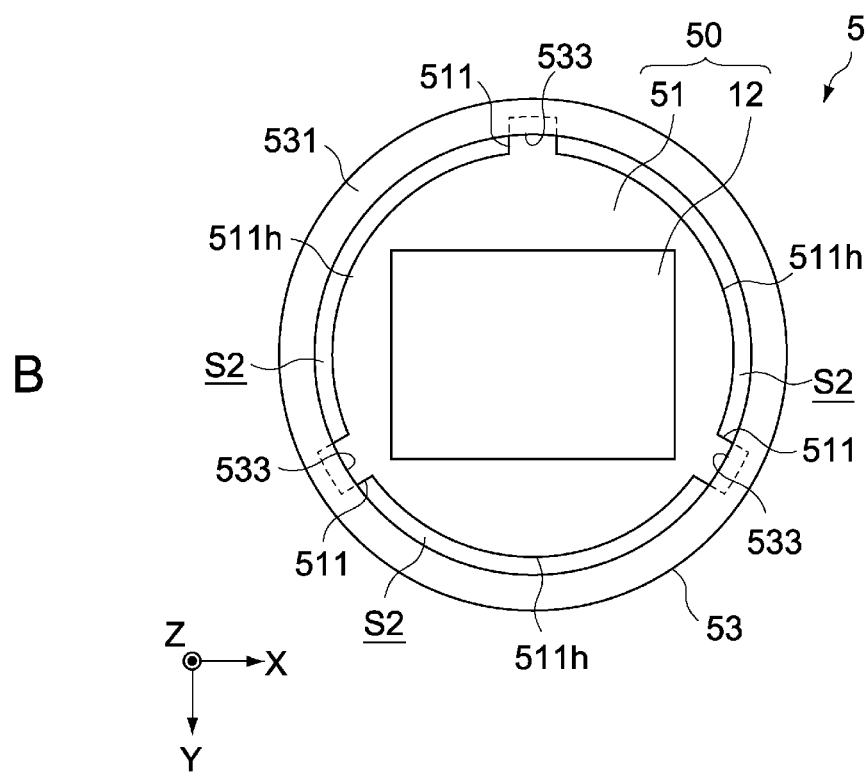

A and B in FIG. 11 are a schematic lateral section view and plan view, respectively, showing the constitution of a speaker unit 5 pertaining to the fourth embodiment of the present invention. Constitutions different from those of the first embodiment are primarily explained below, and the same constitutions as in the first embodiment are not explained or explained briefly using the same symbols.

The speaker unit 5 in this embodiment has a piezoelectric speaker 50 and support member 53. The speaker unit 5 is housed inside a housing not illustrated here, to constitute an electroacoustic transducer for an earphone, headphone, etc.

The piezoelectric speaker 50 has a vibration plate 51 and piezoelectric element 12.

The vibration plate 51 is shaped roughly as a disk constituted by conductive material or resin material, and its periphery has multiple projecting pieces 511 that project radially toward the perimeter. The multiple projecting pieces 511 are typically formed at equal angular intervals, but they may also be formed at unequal intervals. The multiple projecting pieces 511 are formed by, for example, providing multiple cutouts 511h along the periphery of the vibration plate 51. The projected amount of the projecting piece 511 is adjusted by the cut-out depth of the cutout 511h. The number of projecting pieces 511 is three in the example shown, but it may be four or more. This way, the vibration plate 11 can be supported within the XY plane in a stable manner.

The support member 53 supports the vibration plate 51 in multiple areas of its periphery. The support member 53 may be constituted by a part of the housing or by a member independent of the housing.

The support member 53 has an annular body 530, and a retention part 533 that retains each projecting piece 511 of the vibration plate 51. The support member 53 is constituted by an injection molding made of synthetic resin material, but the foregoing is not the only material and it can also be constituted by metal material.

The annular body 530 is constituted by a ring-shaped or cylindrical member of an inner diameter greater than the outer diameter of the vibration plate 51, and has a first end 531 facing the periphery of the vibration plate 51 and a second end 532 on the opposite side.

The retention part 533 is provided in a manner projecting diametrically inward to the inner periphery surface of the first end 531 of the annular body 530. The retention part 533 is a structure that sandwiches each projecting piece 511 of the vibration plate 51 in its thickness direction, and is typically constituted by a resin molding formed when the vibration plate 51 is insert-molded. The retention part 533 is constituted in a manner partially retaining the tip of each projecting piece 511 so that the cutout 511h is partially exposed to the exterior, as shown in B in FIG. 11.

With the speaker unit 5 in this embodiment as constituted above, the vibration plate 51 is supported by the support member 53 via the multiple projecting pieces 511 formed along its periphery, and therefore binding of the periphery of the vibration plate 51 is mitigated. This way, operations and effects can be achieved that are similar to those in the first embodiment.

Also, the speaker unit 5 in this embodiment may be further equipped with an dynamic speaker 25. In this case, the dynamic speaker 25 is placed inside the support member 53 in a manner facing the Z-axis direction of the piezoelectric speaker 50 (vibration plate 51). In the example, the annular body 530 is constituted by a cylindrically shaped member, and the outer periphery surface of the dynamic speaker 25 is bonded and fixed to the inner periphery surface of the second end 532 thereof. In addition to the above, the dynamic speaker 25 may be supported by a member different from the support member 53.

Also in this embodiment, a void S2 (cutout 511h) formed between the multiple projecting pieces 511 may be constituted as a passage to let the sound generated by the dynamic speaker 25 pass through.

This way, it becomes possible to adjust the frequency characteristics of the sound waves played back by the dynamic speaker 25. This also makes it possible to optimize the frequency characteristics around the cross point between the high-pitch sound characteristic curve played back by the piezoelectric speaker 50 and the low-pitch sound characteristic curve played back by the dynamic speaker 25.

Fifth Embodiment

Figure 12:
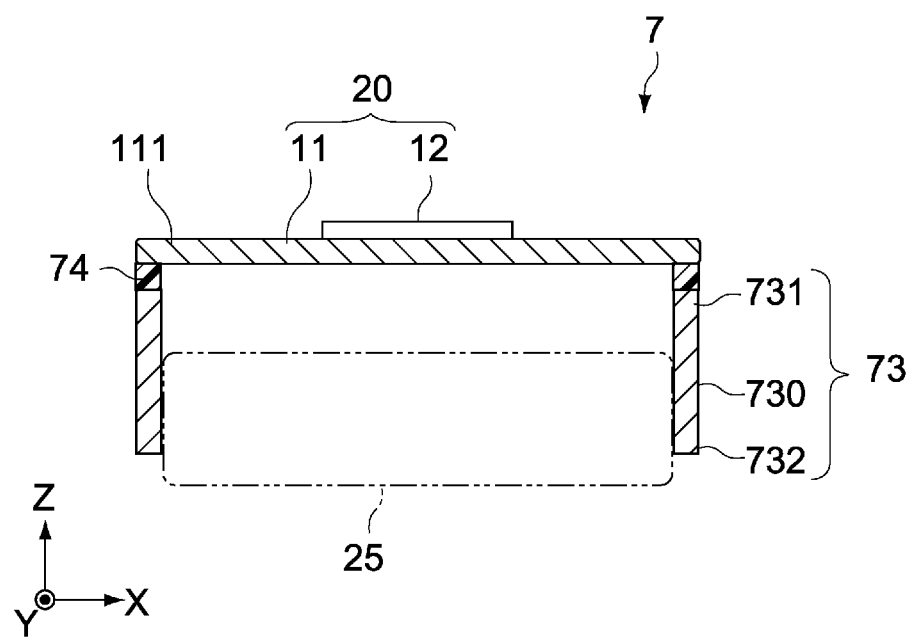
FIG. 12 is a schematic lateral section view of the speaker unit of an electroacoustic transducer pertaining to the fifth embodiment of the present invention.

FIG. 12 is a schematic lateral section view showing the constitution of a speaker unit 7 pertaining to the fifth embodiment of the present invention. Constitutions different from those of the first embodiment are primarily explained below, and the same constitutions as in the first embodiment are not explained or explained briefly using the same symbols.

The speaker unit 7 in this embodiment has a piezoelectric speaker 20, support member 73, and adhesive layer 74. The speaker unit 7 is housed inside a housing not illustrated here, to constitute an electroacoustic transducer for an earphone, headphone, etc.

In this embodiment, the support member 73 elastically supports the periphery 111 of the vibration plate 11 all around. The support member 73 may be constituted by a part of the housing or by a member independent of the housing.

The support member 73 is constituted by an annular body 730 having a first end 731 and second end 732. The annular body 730 is constituted by a ring-shaped or cylindrical member of an inner diameter greater than the outer diameter of the vibration plate 11, where the first end 731 faces the periphery 111 of the vibration plate 11, while the second end 732 is provided on the opposite side to the first end 731. The support member 73 is constituted by an injection molding made of synthetic resin material, but the foregoing is not the only material and it can also be constituted by metal material.

The adhesive layer 74 is constituted by an elastically deformable adhesive material provided between the periphery 111 of the vibration plate 11 and the first end 731 of the support member 73.

The adhesive layer 74 is not specifically limited so long as it is adhesive material that exhibits elasticity when cured, but typically it is constituted by silicone resin, urethane resin, or other elastically deformable resin material. This way, the periphery 111 of the vibration plate 11 is elastically supported by the support member 73.

The adhesive layer 74 may include spherical insulation fillers of uniform grain size. By constituting the adhesive layer 74 with adhesive material in which insulation fillers are dispersed, the thickness of the adhesive layer 74 can be adjusted accurately. This allows for highly accurate control of the vibration damping function of the vibration plate 11 by the adhesive layer 74, making it possible to achieve desired high-frequency characteristics in a stable manner.

Or, the adhesive layer 74 may be constituted by double-sided tape (double-sided adhesive tape). Constituting the adhesive layer 74 with double-sided tape makes it easy to control the thickness of the adhesive layer 74.

Also, the speaker unit 7 in this embodiment may be further equipped with an dynamic speaker 25. In this case, the dynamic speaker 25 is placed inside the support member 73 in a manner facing the Z-axis direction of the piezoelectric speaker 20 (vibration plate 11). In the example, the annular body 730 is constituted by a cylindrically shaped member, and the outer periphery surface of the dynamic speaker 25 is bonded and fixed to the inner periphery surface of the second end 732 thereof. In addition to the above, the dynamic speaker 25 may be supported by a member different from the support member 73.

The speaker unit 7 of this embodiment as constituted above can also achieve operations and effects similar to those in the first and second embodiments mentioned above.

Sixth Embodiment

Figure 13:
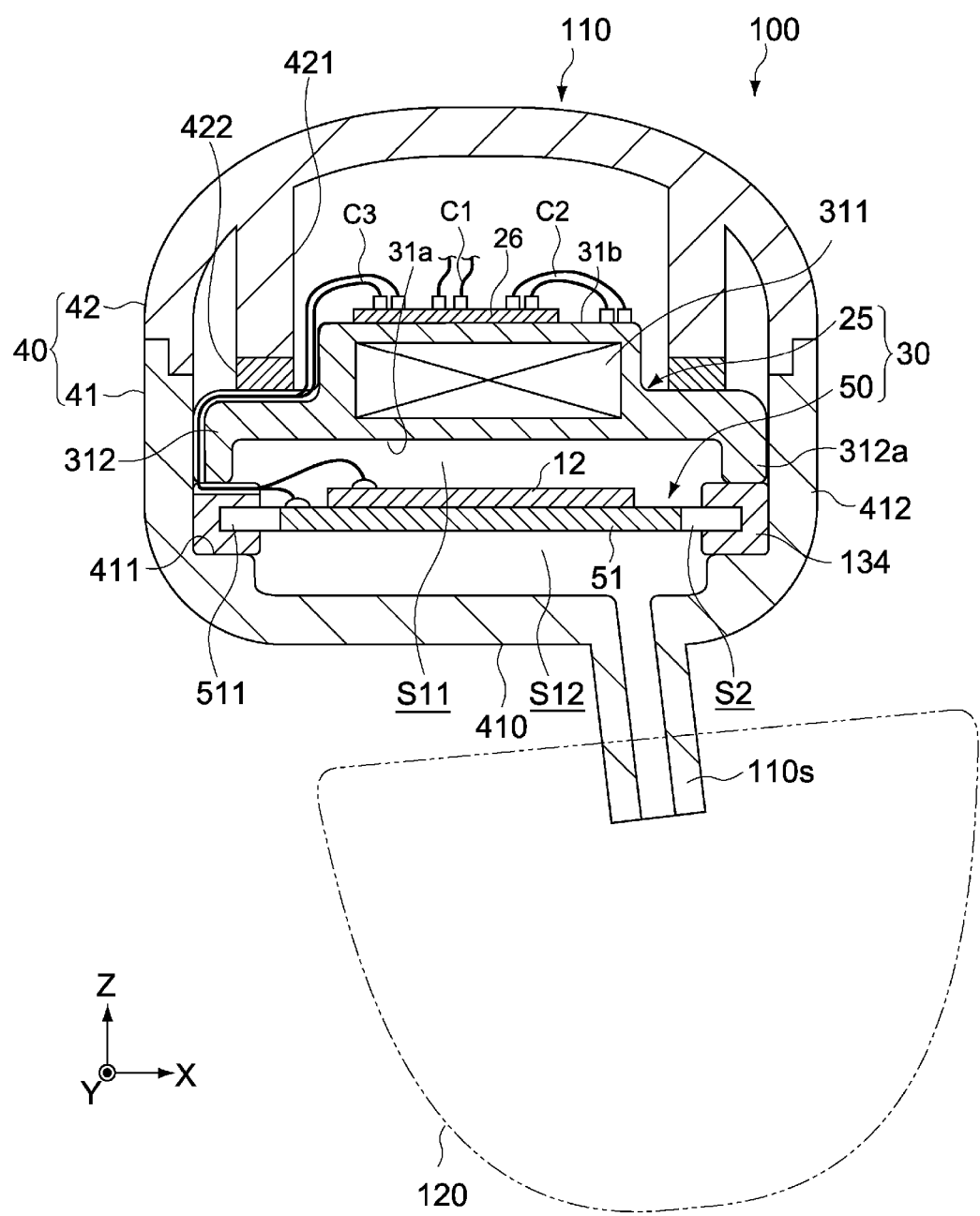
FIG. 13 is a schematic lateral section view of an electroacoustic transducer pertaining to the sixth embodiment of the present invention.

Next, the sixth embodiment of the present invention is explained. FIG. 13 is a lateral section view schematically showing the constitution of an earphone 100 as an electroacoustic transducer pertaining to this embodiment.

The earphone 100 has an earphone body 110 and earpiece 120. The earpiece 120 is attached to a sound path 110s of the earphone body 110, while constituted in such a way that it can be worn on the user's ear.

The earphone body 110 has a sounding unit 30, and a housing 40 that houses the sounding unit 30.

The sounding unit 30 has an dynamic speaker 25 and piezoelectric speaker 50. The housing 40 has a housing 41 and cover 42.

The housing 41 has the shape of a cylinder with a bottom and is typically constituted by injection-molded plastics. The housing 41 has an interior space in which the sounding unit 30 is housed, and at its bottom 410 the sound path 110s is provided that connects to the interior space.

The housing 41 has a support 411 that supports the piezoelectric speaker 50, and a side wall 412 enclosing the sounding unit 30 all around. The support 411 and side wall 412 are both formed in a ring shape, where the support 411 is provided in such a way that it projects inward from near the bottom of the side wall 412. The support 411 is formed by a plane running in parallel with the XY plane, and supports the periphery of the piezoelectric speaker 50 indirectly via an annular member 134 constituted by a separate member independent of the housing 41.

The dynamic speaker 25 is constituted by a speaker unit that functions as a woofer to play back low-pitch sounds. In this embodiment, it is constituted by a dynamic speaker that primarily generates sound waves of 7 kHz or below, for example, and has a mechanism 311 containing a voice coil motor (electromagnetic coil) or other vibration body, and a base 312 that vibratively supports the mechanism 311. The base 312 is formed roughly in the shape of a disk whose outer diameter is roughly identical to the inner diameter of the side wall 412 of the housing 41.

The dynamic speaker 25 roughly has the shape of a disk having a first surface 31a facing the piezoelectric speaker 50 and a second surface 31b on the opposite side. Provided along the periphery of the first surface 31a is a leg 312a contactively facing the annular member 134 supporting the periphery of the piezoelectric speaker 50. The leg 312a is formed in a ring shape, but it is not limited to the foregoing and may be constituted by multiple pillars.

The second surface 31b is formed on the surface of a disk-shaped projection provided at the center of the top surface of the base 312. The second surface 31b has a circuit board 26 fixed to it that constitutes the electrical circuit of the sounding unit 30. Provided on the surface of the circuit board 26 are multiple terminals that connect to various wiring members. The wiring members connected to the terminals of the circuit board 26 include a wiring member C1 for inputting the playback signals sent from a playback device not illustrated here, wiring member C2 connected to the input terminal of the dynamic speaker 25, and wiring member C3 connected to the piezoelectric speaker 50.

The piezoelectric speaker 50 constitutes a speaker unit that functions as a tweeter to play back high-pitch sounds. In this embodiment, its oscillation frequency is set in such a way to primarily generate sound waves of 7 kHz or above, for example. The piezoelectric speaker 50 has a vibration plate 51 and piezoelectric element 12. The vibration plate 51 has multiple projecting pieces 511 that project diametrically from its periphery, and these projecting pieces 511 are supported by the annular member 134. The annular member 134 is placed between the support 411 of the housing 41 and a periphery 321c of a vibration plate 321. The outer diameter of the annular member 134 is formed roughly identical to the inner diameter of the side wall 412 of the housing 41.

In other words, the piezoelectric speaker 50 is constituted in the same manner as the piezoelectric speaker explained in the fourth embodiment mentioned above, and the annular member 134 corresponds to the support member 53 in the fourth embodiment.

The interior space of the housing 41 is divided into a first space S11 and second space S12 by the piezoelectric speaker 50, as shown in FIG. 13. The first space S11 is a space where the dynamic speaker 25 is housed, formed between the dynamic speaker 25 and piezoelectric speaker 50. The second space S12 is a space connecting to the sound path 110s, formed between the piezoelectric speaker 50 and the bottom 410 of the housing 41.

The cover 42 is fixed to the top edge of the side wall 412 so as to block off the interior of the housing 41. A feedthrough is provided at a specified position of the cover 42, in order to lead the wiring member C1 to a playback device not illustrated here. The interior top surface of the cover 42 has a pressure part 421 that presses the dynamic speaker 25 toward the annular member 134. The pressure part 421 of the cover 42 is formed in a ring shape, and its tip contacts the top surface of the dynamic speaker 25, via an elastic layer 422. This way, the dynamic speaker 25 is pressed with a uniform force by the entire circumference of the annular member 134, thus making it possible to position the sounding unit 30 properly inside the housing 41.

Next, a typical operation of the earphone 100 of this embodiment as constituted above is explained.

With the earphone 100 of this embodiment, playback signals are input to the circuit board 26 of the sounding unit 30 via the wiring member C1. The playback signals are input to the dynamic speaker 25 and piezoelectric speaker 50 via the circuit board 26 and wiring members C2, C3, respectively. As a result, the dynamic speaker 25 is driven, and low-pitch sound waves primarily of 7 kHz or below are generated.

With the piezoelectric speaker 50, the vibration plate 51 vibrates due to the expansion/contraction action of the piezoelectric element 12, and high-pitch sound waves primarily of 7 kHz or above are generated. The generated sound waves in different bands are transmitted to the user's ear via the sound path 110s. This way, the earphone 100 functions as a hybrid speaker having a sounding body for low-pitch sounds and sounding body for high-pitch sounds.

Here, a hybrid speaker is known to easily generate sibilant sounds in a high-frequency band near 9 to 10 kHz. In other words, sound pressure peaks that do not manifest when a tweeter alone is used often become prominent when a woofer is combined, and this leads to amplification of sibilant sounds to a level where they can no longer be ignored.

Accordingly in this embodiment, the vibration plate 51 of the piezoelectric speaker 50 constituted as a tweeter is supported in multiple areas (projecting pieces 511) of its periphery 511 (refer to A and B in FIG. 11). This way, the high-frequency characteristics of the piezoelectric speaker 50 can be improved as mentioned above, which allows for suppression of sibilant sounds while still maintaining a desired sound pressure level, to generate high-quality playback sound waves. Furthermore, the ability to improve sound pressure levels in high-pitch bands of 10 kHz and above allows for further improvement of sound quality.

Also according to this embodiment, the void S2 formed between the multiple projecting pieces 511 of the vibration plate 51 functions as a passage to let the sound generated by the dynamic speaker 25 pass through (refer to FIG. 13). This way, it becomes possible to adjust the frequency characteristics of the sound waves played back by the dynamic speaker 25. This also makes it possible to optimize the frequency characteristics around the cross point between the high-pitch sound characteristic curve played back by the piezoelectric speaker 50 and the low-pitch sound characteristic curve played back by the dynamic speaker 25.

The foregoing explained embodiments of the present invention, but the present invention is not limited to the aforementioned embodiments and it goes without saying that various modifications may be added.

For example, while the annular member 134 supporting the piezoelectric speaker 50 is constituted by a separate member independent of the housing 41 in the sixth embodiment above, it may be constituted as part of the housing 41.

Figure 14:
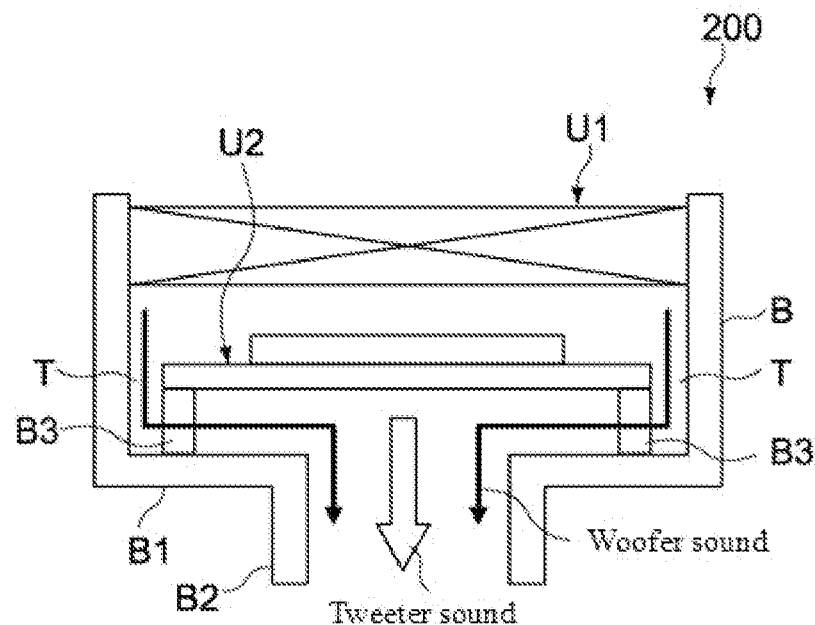
FIG. 14 is a schematic lateral section view showing a constitutional variation example of the electroacoustic transducer shown in FIG. 13.

For example, an electroacoustic transducer 200 schematically shown in FIG. 14 is constituted in such a way that an dynamic speaker U1 and piezoelectric speaker U2 are housed inside a housing B, respectively, so that the sound waves generated by the sounding bodies U1, U2 are guided to a sound path B2 formed at a bottom B1 of the housing B. Then, the constitution is such that multiple areas along the periphery of the vibration plate constituting the piezoelectric speaker U2 are supported by multiple pillars B3 formed at the bottom B1 of the housing B.

With the electroacoustic transducer 200 shown in FIG. 14, the multiple pillars B3 are formed as part of the housing B and the periphery of the vibration plate is joined to the top surface of each pillar B3 via adhesive agent or elastically deformable adhesive material, for example. In this case, each pillar B3 corresponds to, for example, each of the multiple projections 233 of the support member 23 as explained in the first embodiment.

Also with the electroacoustic transducer 200, the piezoelectric speaker U2 is formed smaller than the inner diameter of the side wall of the housing B. Accordingly, the low-pitch sound waves generated by the dynamic speaker U1 are guided to the sound path B2 through a passage T formed by the ring-shaped space between the piezoelectric speaker U2 and the side wall of the housing B and the space formed between the multiple pillars B3.

Furthermore, the passage through which the sound generated by the dynamic speaker passes may be provided on the vibration plate of the piezoelectric speaker. For example, a piezoelectric speaker 60 of a speaker unit 6 shown in FIG.

15 has a vibration plate 61 on which multiple circular through holes 612 are formed around the piezoelectric element 12. The remainder of the constitution is similar to the constitution of the speaker unit 2 pertaining to the first embodiment which was explained by referring to FIGS. 3, 4 and 6, and thus not explained.

Figure 15:
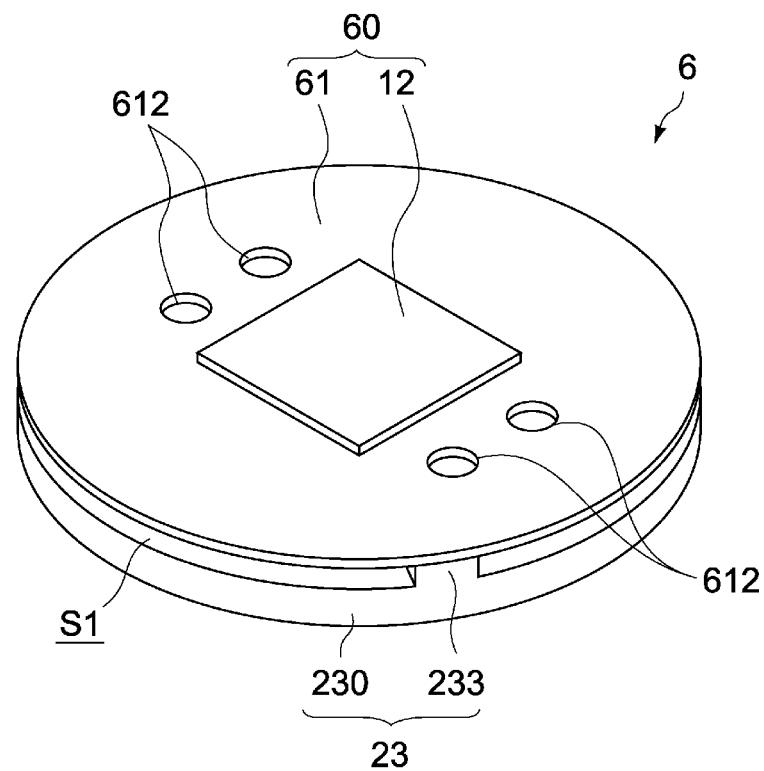
FIG. 15 is a general perspective view showing a constitutional variation example of the speaker unit shown in FIG. 3.

The dynamic speaker not illustrated in FIG. 15 is placed in a manner facing the vibration plate 61 (refer to FIG. 6). Accordingly, the sound waves generated by the dynamic speaker pass through the multiple through holes 612 formed on the vibration plate 61. The void S1 formed between the multiple projections 233 supporting the periphery of the vibration plate 61 may also function as a passage for the sound waves. Furthermore, although not illustrated, a cutout of specified shape may be formed along the periphery of the vibration plate in place of the through hole 612 to constitute the passage. One or multiple cutouts may be provided and if there are multiple cutouts, the shape of each cutout may be the same or different. The vibration plate on which cutouts (passages) are formed partially along the circular periphery is also included in the context of a "disk-shaped vibration plate."

Also, while the piezoelectric speaker 50 was provided on the support 411 of the housing 41 in the sixth embodiment above, instead the periphery of the vibration plate may be joined to the top surface of the support 411 via an adhesive layer, for example. In this case, the leg 312a of the base 312 of the dynamic speaker 25 may or may not be contacting the periphery of the vibration plate.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2014-243807, filed Dec. 2, 2014, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. An electroacoustic transducer comprising:
    a piezoelectric speaker having a vibration plate with a periphery, and a piezoelectric element joined to the vibration plate;
    a housing for housing the piezoelectric speaker;
    a support member constituted by a part of the housing or by a separate member, to support the vibration plate in multiple areas along the periphery, wherein the support member has multiple projections to support the periphery of the vibration plate; and
    an dynamic speaker housed inside the housing, wherein a void between the multiple projections is constituted as a passage to let sound generated by the dynamic speaker pass through.

2. An electroacoustic transducer according to claim 1, wherein the multiple projections project toward the periphery of the vibration plate.

3. An electroacoustic transducer according to claim 2, further comprising an elastically deformable adhesive layer filling a void between the multiple projections.

4. An electroacoustic transducer according to claim 2, wherein the multiple areas consist of at least three areas.

5. An electroacoustic transducer according to claim 1, wherein the vibration plate has a disk shape and the support member further has an annular body facing the periphery of the vibration plate on which the multiple projections are provided.

6. An electroacoustic transducer according to claim 5, wherein the multiple areas consist of at least three areas.

7. An electroacoustic transducer according to claim 1, wherein the multiple areas along the periphery of the vibration plate include multiple projecting pieces that project radially toward a perimeter of the vibration plate.

8. An electroacoustic transducer according to claim 7, wherein the multiple areas consist of at least three areas.

9. An electroacoustic transducer according to claim 1, wherein the multiple areas consist of at least three areas.

10. An electroacoustic transducer according to claim 3, wherein the multiple areas consist of at least three areas.

11. An electroacoustic transducer comprising:
    a piezoelectric speaker having a vibration plate with a periphery, and a piezoelectric element joined to the vibration plate;
    a housing for housing the piezoelectric speaker;
    a support member constituted by a part of the housing or by a separate member, to support the vibration plate in multiple areas along the periphery, wherein the multiple areas along the periphery of the vibration plate include multiple projecting pieces that project radially toward a perimeter of the vibration plate; and
    an dynamic speaker housed inside the housing, wherein a void between the multiple projecting pieces is constituted as a passage to let sound generated by the dynamic speaker pass through.

12. An electroacoustic transducer according to claim 11, wherein the multiple areas consist of at least three areas.

13. An electroacoustic transducer comprising:
    a piezoelectric speaker having a vibration plate with a periphery,
    a piezoelectric element joined to the vibration plate, and
    a through hole provided in an area between the piezoelectric element on the vibration plate and the periphery;
    a housing for housing the piezoelectric speaker;
    an dynamic speaker housed inside the housing and having a vibration body; and a support member constituted by a part of the housing or by a separate member, to support the vibration plate in multiple areas along the periphery.

* * * * *